United States Patent [19]

Bernardson

[11] Patent Number: 4,596,027
[45] Date of Patent: Jun. 17, 1986

[54] COUNTER/DIVIDER APPARATUS

[75] Inventor: Peter Bernardson, Tempe, Ariz.

[73] Assignee: GTE Products Corporation, Stamford, Conn.

[21] Appl. No.: 747,675

[22] Filed: Jun. 24, 1985

Related U.S. Application Data

[63] Continuation of Ser. No. 411,160, Aug. 25, 1982, abandoned.

[51] Int. Cl.$^4$ .................... H03K 23/00; H03K 23/66
[52] U.S. Cl. ........................................ 377/33; 377/39; 377/106; 377/118; 377/110
[58] Field of Search ............... 377/106, 110, 114, 118, 377/33, 84, 39

[56]  References Cited

U.S. PATENT DOCUMENTS

| | | | |
|---|---|---|---|
| 2,566,085 | 8/1951 | Green | 377/106 |
| 2,853,238 | 9/1958 | Johnson | 377/106 |
| 3,147,442 | 9/1964 | Fritzsche et al. | 377/114 |
| 3,614,631 | 11/1969 | Be Vier | 377/110 |
| 3,760,356 | 9/1973 | Srivastava | 377/39 |
| 4,027,175 | 5/1977 | Hurst | 377/114 |
| 4,079,234 | 3/1978 | Kashio | 377/39 |
| 4,150,337 | 4/1979 | Sheller | 377/114 |
| 4,165,459 | 8/1979 | Curtice | 377/39 |
| 4,305,123 | 12/1981 | Scibor-Rylski | 377/39 |

FOREIGN PATENT DOCUMENTS 0725239  3/1980  U.S.S.R. ............................ 377/114

OTHER PUBLICATIONS

Hogarth, "Programmable Divider", Practical Electronics, vol. 15, No. 4, Apr. 1979.
Grinich et al., "Introduction to Integrated Circuits"; McGraw-Hill, New York, 1975, p. 568.

Primary Examiner—Stanley D. Miller
Assistant Examiner—Timothy P. Callahan
Attorney, Agent, or Firm—David M. Keay

[57]  ABSTRACT

A counter/divider apparatus employing an array of counters arranged in parallel. Each counter repeatedly counts through a sequence of a number of clock pulses. The number is different for each counter and the numbers are relatively prime numbers. The outputs of the counters are applied to a detector that recognizes a preset combination of output signals which is present after a predetermined number of clock pulses have been received. The detector then produces an output pulse which clears all the counters to their initial states, and the cycle is repeated. The apparatus thus divides the input clock pulses by the aforementioned predetermined number.

7 Claims, 6 Drawing Figures

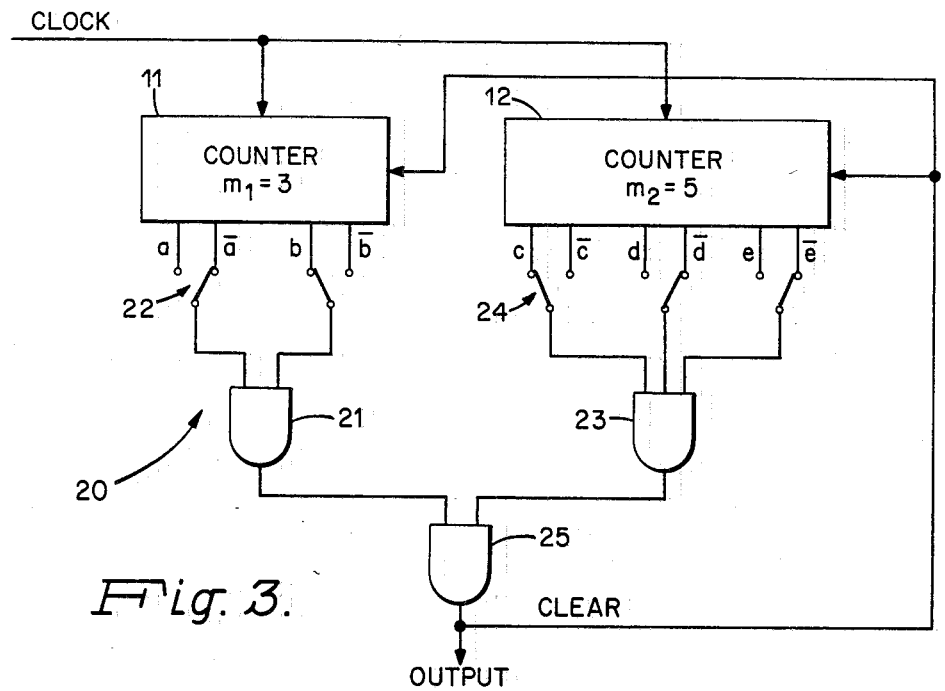
Fig. 3.
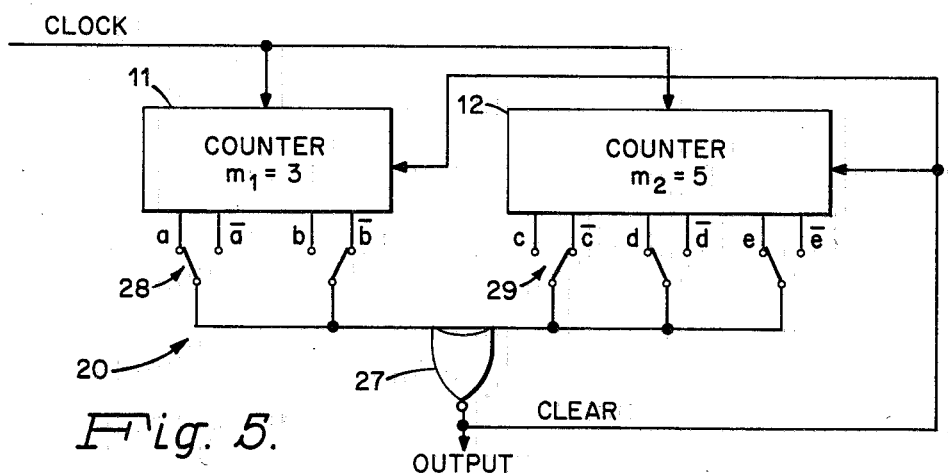
Fig. 4A.
Fig. 4B.
Fig. 5.

COUNTER/DIVIDER APPARATUS

This is a continuation of co-pending application Ser. No. 411,160 filed on Aug. 25, 1982, now abandoned.

BACKGROUND OF THE INVENTION

This invention relates to counter/divider apparatus. More particularly, it is concerned with apparatus which can count to or divide by a fairly large number in response to received input pulses.

Counting circuits which receive clock pulses, accumulate a count thereof, and produce an output signal after a predetermined number of pulses have been counted are widely used in various forms of information processing equipment. The circuit functions as a divider by producing a single output signal each time the predetermined number of clock pulses has been received. Presently available circuitry for providing the desired function becomes relatively complicated when the predetermined number of pulses to be counted, the divisor, is large. In addition, with presently available circuitry it is difficult to change the value of the divisor. Furthermore, it is extremely difficult to expand the circuitry by adding components. Thus, counter/divider apparatus heretofore available lacks flexibility which may be extremely desirable or essential for certain applications.

SUMMARY OF THE INVENTION

Improved counting apparatus in accordance with the present invention comprises a plurality of counting means. Each counting means counts repeatedly through a sequence of a different number of clock pulses and produces an output signal representing the accumulated count during each sequence. The different number for each of the counting means is a relatively prime number with respect to the different numbers for each of the other counting means of the plurality. A source of clock pulses applies clock pulses to each of the counting means of the plurality. The apparatus also includes detecting means which is coupled to each of the counting means of the plurality and has an output terminal. The detecting means produces an output signal at the output terminal in response to a combination of predetermined output signals from the plurality of counting means. Each of the counting means of the plurality has a clear connection which is coupled to the output terminal of the detecting means. In response to an output signal at the output terminal the counting means is cleared of the accumulated count.

Counting apparatus in accordance with the present invention can be programmed to count through any number of clock pulses up to the product of the different numbers in the sequence of all of the counting means of the plurality. That is, the apparatus can divide by any divisor up to the product of all the different numbers. The different numbers are relatively prime. That is, they have no common factor other than one.

BRIEF DESCRIPTION OF THE DRAWING

In the drawing:

FIG. 3 is a logic block diagram illustrating a specific embodiment of apparatus in accordance with the present invention arranged for a specific mode of operation;

FIGS. 4A and 4B are tables useful in explaining the operation of the specific embodiment of FIG. 3; and FIG. 5 is a logic block diagram illustrating another specific embodiment of apparatus in accordance with the present invention arranged for a specific mode of operation.

Figures 1, 2:
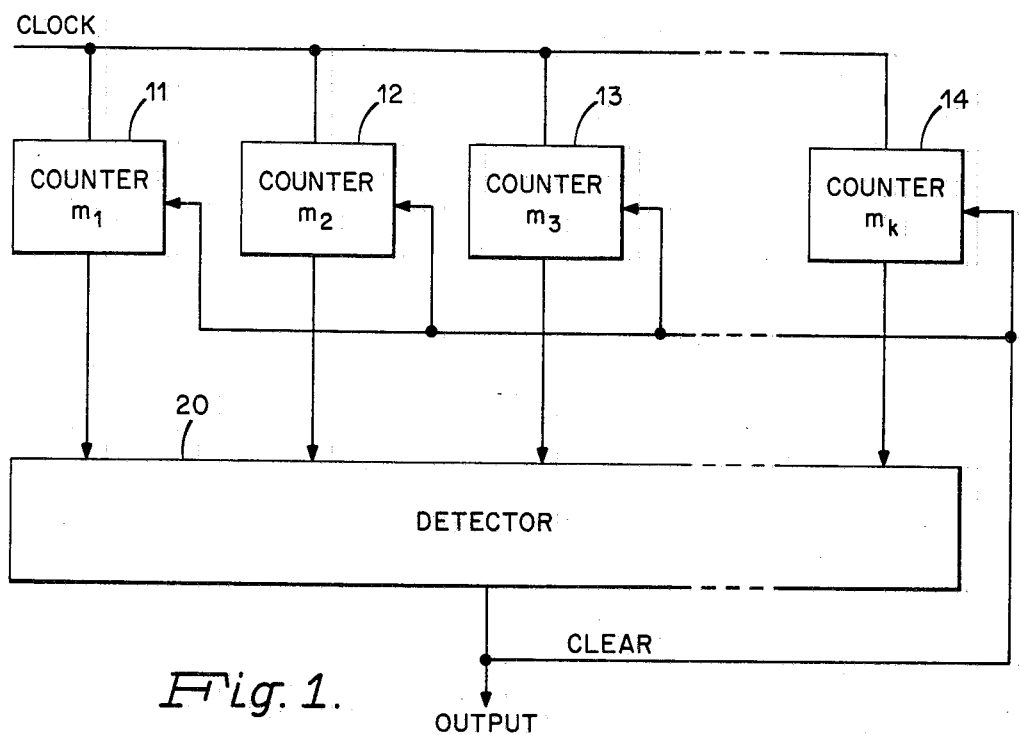
FIG. 1 is a schematic block diagram illustrating counting apparatus in accordance with the present invention.
FIG. 2 is a table useful in explaining the operation of an exemplary configuration of apparatus in accordance with FIG. 1.

For a better understanding of the present invention together with other and further objects, advantages, and capabilities thereof, reference is made to the following discussion and appended claims in connection with the above-described drawing.

DETAILED DESCRIPTION OF THE INVENTION

FIG. 1 is a block diagram illustrating a generalized version of counting apparatus in accordance with the present invention. The apparatus includes an array of counters labeled 11, 12, 13, and 14 arranged in parallel. CLOCK input pulses are applied to each of the counters 11–14. Each counter counts repeatedly to a value of a particular number of CLOCK pulses. The counters 11, 12, 13, and 14 are designated as counting to values of $m_1$, $m_2$, $m_3$, and $m_k$, respectively. As indicated, the apparatus may include any number k of counters. The values of $m_1$, $m_2$, $m_3$, . . . $m_k$ are different. Each value $m_1$, $m_2$, $m_3$, . . . $m_k$ is a relatively prime number with respect to the other values. That is, the values $m_1$, $m_2$, $m_3$, . . . $m_k$ have no common factor, except one. The output from each of the counters is a representation of the accumulated count in the counter. After counting through the number of CLOCK pulses as designated by its particular value of m, each individual counter 11–14 returns to an initial state and repeats its cycle of counting through a sequence of m CLOCK pulses.

The outputs of the counters 11–14 are applied to a detector 20. The detector is programmed to recognize a combination of particular output signals from the counters produced after counting through n CLOCK pulses as designated by $n(l_1, l_2, l_3, \ldots l_k)$ where $l_1$ is from the interval $0, 1, \ldots, m_1 - 1$, inclusive, $l_2$ is from the interval $0, 1, \ldots, m_2 - 1$, inclusive, and $l_k$ is from the interval $0, 1, \ldots, m_k - 1$, inclusive. Since the values $m_1, m_2, m_3, \ldots m_k$ are relatively prime, the total number of different combination of outputs from the counters is $P = m_1 \cdot m_2 \cdot m_3 \ldots m_k$. When the programmed combination of output signals is recognized by the detector, it produces an output signal at its OUTPUT terminal. This signal is also applied to all the counters 11–14 as a CLEAR signal which resets them to their initial states clearing them of the counts accumulated therein. The cycle is then repeated producing an output signal at the OUTPUT terminal each time the combination of particular output signals from the counters is recognized by the detector 20. The apparatus thus operates as a divider dividing by a divisor represented by the combination of particular output signals from the counters as programmed in the detector. The divisor can be any number up to the value of P.

In order to provide a simplified example of the apparatus and its operation it is assumed that the apparatus employs two counts $m_1$ and $m_2$ having values of 3 and 5, respectively. The value of P is $3 \times 5 = 15$. FIG. 2 is a table illustrating the accumulated counts within the counters $m_1 = 3$ and $m_2 = 5$ during a complete cycle of a maximum of 15 clock pulses. As can be seen from the table each CLOCK pulse of the cycle produces a unique combination of accumulated counts and consequently of output signals. If, for example, it is desired to count repeatedly through a sequence of n=11 CLOCK pulses, the detector 20 is programmed to respond to an output signal from the $m_1$ counter indicating $l_1=2$ and to an output signal from the $m_2$ counter indicating $l_2=1$. When this combination of output signals is detected on the 11th CLOCK pulse, the detector 20 produces an output pulse which also functions as a CLEAR signal to the counters resetting them to the initial states with output signals indicating "0." The apparatus thus operates as a divider with a divisor of 11.

FIG. 3 is a logic block diagram of counting apparatus employing two counters 11 and 12 with values of $m_1=3$ and $m_2=5$, respectively. Thus the table of FIG. 2 is pertinent to the apparatus as shown in FIG. 3. As illustrated in FIG. 3 each of the counters produces an output signal in binary digital format. The $m_1$ counter 11 which counts through a count of 3 has two output terminals labeled a and b and also corresponding terminals labeled $\bar{a}$ and $\bar{b}$ for the inverted values. The $m_2$ counter 12 which counts to 5 has three output terminals c, d, and e and corresponding terminals $\bar{c}$, $\bar{d}$, and $\bar{e}$ for the inverted values.

The detector 20 includes an AND gate 21 having two inputs which are connected to either the a or $\bar{a}$ and the b or $\bar{b}$ output terminals of the $m_1$ counter 11 as determined by selection switches 22 shown schematically in FIG. 3. Similarly, another AND gate 23 has three inputs each of which is connected to one of each pair of output terminals c or $\bar{c}$, d or $\bar{d}$, and e or $\bar{e}$ of the $m_2$ counter 12 through selection switches 24. The outputs of the AND gates 21 and 23 as applied as inputs to a third AND gate 25. The OUTPUT of AND gate 25 at the output terminal is applied to clear connections of the counters 11 and 12.

FIG. 4A is a table illustrating in binary digital format the output signals at the output terminals a, $\bar{a}$, b, and $\bar{b}$ of the $m_1$ counter 11 upon receiving each of the three CLOCK pulses of a sequence. FIG. 4B is a similar table illustrating the output signals at the output terminals of the $m_2$ counter 12, c, $\bar{c}$, d, $\bar{d}$, e, and $\bar{e}$, upon receiving each of the five CLOCK pulses of a sequence.

The specific embodiment illustrated in FIG. 3 as indicated from the tables of FIGS. 2, 4A, and 4B is programmed by the setting of selection switches 22 and 24 to count repeatedly through a count of 11 CLOCK pulses, thus functioning as a divide-by-11 divider. The selection switches 22 are set to connect the $\bar{a}$ and b output connections of the $m_1$ counter 11 to the AND gate 21. Thus the AND gate 21 produces an output signal when the $m_1$ counter 11 has a count having the value of $l_1=2$ stored therein. The switches 24 are set to connect the c, $\bar{d}$, and $\bar{e}$ output connections of the $m_2$ counter 12 to the AND gate 23. Thus the AND gate 23 produces an output signal when the contents of the $m_2$ counter 12 indicate an accumulated count having the value of $l_2=1$. This combination of output signals causes the AND gate 25 to produce an OUTPUT/CLEAR signal resetting the counters 11 and 12 to their initial states in readiness for repeating the cycle.

FIG. 5 is a modification of the apparatus of FIG. 3 employing an $m_1$ counter 11 in which $m_1=3$ and an $m_2$ counter 12 in which $m_2=5$. In this embodiment the detector 20 includes a single NOR gate 27 having a set of five inputs, one for each pair of output terminals of the counters 11 and 12. Each input is connected to a selected one of the output terminals of the associated pair by switches 28 and 29, shown schematically in FIG. 5. As shown in FIG. 5, the a and $\bar{b}$ output terminals of the $m_1$ counter 11 and the $\bar{c}$, d, and e output terminals of the $m_2$ counter 12 are connected to the inputs of the NOR gate 27 by the setting of the switches 28 and 29. Thus, the NOR gate 27 responds to an accumulated count value of $l_1=2$ in the $m_2$ counter 11 simultaneously with an accumulated count value of $l_2=1$ in the $m_1$ counter 12 to produce an OUTPUT/CLEAR signal at the output terminal. The apparatus is thus programmed to operate as a divide-by-11 divider.

Apparatus such as that shown in the specific embodiments of FIGS. 3 and 5 is readily amenable to fabrication by integrated circuit technology. The switches 22, 24, 28, and 29 may be built-in semiconductor switches operated under control of a ROM. The individual counters may be any of various well-known types of counters which can be arranged to count repeatedly through a recurring sequence of a particular number of input pulses. Since the CLOCK pulses are applied to all the counters in parallel, for a sufficiently high CLOCK frequency ($\gtrsim 10$ kHz) all the counters $m_1, m_2, \ldots, m_k$ can be dynamic even for extremely long divisions.

The apparatus is amenable to further expansion as by adding counters with appropriate switches and AND gates for the embodiment of FIG. 3. The embodiment of FIG. 5 may be expanded by adding counters and switches and merely additional inputs to the single NOR gate 27. In anticipation of possible additional expansion of the apparatus of FIG. 5 the NOR gate 27 may be fabricated with additional inputs which are connected to ground until needed. The values of the counts of the added counters must be relatively prime with respect to the values of all the other counters of the apparatus. The apparatus as shown and described thus provides a high degree of flexibility as a counter or divider.

While there has been shown and described what are considered preferred embodiments of the present invention, it will be obvious to those skilled in the art that various changes and modifications may be made therein without departing from the invention as defined by the appended claims.

What is claimed is:

1. Counting apparatus comprising
   a plurality of counting means, each being operable to count repeatedly through a sequence of a different number of clock pulses and to produce an output signal representing the count accumulated therein during each sequence, said different number for each counting means being a relatively prime number with respect to said different number for each of the other counting means of the plurality;
   a source of clock pulses connected to each of said counting means in parallel for applying clock pulses to each of the counting means of the plurality; each of the counting means counting each clock pulse; and
   detecting means coupled to each of the counting means of the plurality and having an output terminal, said detecting means being operable to produce an output signal at the output terminal in response to a combination of predetermined output signals from the plurality of counting means;
   each of said counting means of the plurality having a clear connection coupled to the output terminal of said detecting means and being operable in response to an output signal thereon to clear the counting means of the count accumulated therein.

2. Counting apparatus in accordance with claim 1 wherein
the combination of predetermined output signals from the plurality of counting means to which the detecting means responds to produce an output signal at the output terminal is selectively variable.

3. Counting apparatus in accordance with claim 1 wherein
each of said counting means includes a set of output connections for producing a set of binary output signals thereon representing the count accumulated in the counting means; and
said detecting means includes logic circuit means having input connections coupled to the sets of output connections of the plurality of counting means, said logic circuit means being operable in response to predetermined sets of binary output signals at the set of output connections of the counting means to produce an output signal at said output terminal.

4. Counting apparatus in accordance with claim 3 including
selection means coupled between the sets of output connections of the plurality of counting means and the input connections of said logic circuit means for selectively varying the predetermined sets of binary output signals from the counting means to which the logic circuit means responds to produce an output signal at the output terminal.

5. Counting apparatus in accordance with claim 3 wherein
said logic circuit means includes a like plurality of first AND gate means, each first AND gate means being coupled to the set of output connections of a different one of the counting means of said plurality and being operable to produce an output indication at an output connection thereof in response to a predetermined set of binary output signals at the set of output connections of the counting means; and
a second AND gate means having a like plurality of input connections, each being connected to the output connection of a different one of said first AND gate means, and having an output connection connected to said output terminal; said second AND gate means being operable to produce an output signal at said output terminal in response to output indications from all of said first AND gate means.

6. Counting apparatus in accordance with claim 3 wherein said logic circuit means includes
NOR gate means having a multiplicity of input connections connected to the sets of output connections of the plurality of counting means and having an output connection connected to said output terminal, said NOR gate means being operable to produce an output signal at said output terminal in response to a predetermined combination of binary output signals at the multiplicity of input connections.

7. Counting apparatus in accordance with claim 3 wherein
the set of output connections of each of said counting means is a group of pairs of output connections, the output signals at each pair of output connections being a pair of binary digits, one binary digit of the pair being non-inverted and the other being inverted;
each of the input connections of said logic circuit means being associated with a different pair of the output connections of said counting means; and including
switching means for selectively connecting one or the other of the output connections of each pair of output connections of said counting means to the associated input connection of said logic circuit means.

* * * * *